United States Patent
Wang

(10) Patent No.: US 9,748,524 B2
(45) Date of Patent: Aug. 29, 2017

(54) LIGHT-EMITTING MEMBER AND METHOD FOR PREPARING THE SAME AS WELL AS DISPLAY DEVICE

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventor: Tong Wang, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 14/907,645

(22) PCT Filed: Sep. 11, 2015

(86) PCT No.: PCT/CN2015/089425
§ 371 (c)(1),
(2) Date: Jan. 26, 2016

(87) PCT Pub. No.: WO2016/141699
PCT Pub. Date: Sep. 15, 2016

(65) Prior Publication Data
US 2016/0268549 A1    Sep. 15, 2016

(30) Foreign Application Priority Data
Mar. 10, 2015    (CN) .......................... 2015 1 0104568

(51) Int. Cl.
*H01L 51/52*    (2006.01)
*H01L 51/56*    (2006.01)

(52) U.S. Cl.
CPC ...... *H01L 51/5271* (2013.01); *H01L 51/5203* (2013.01); *H01L 51/5225* (2013.01); *H01L 51/5218* (2013.01); *H01L 51/56* (2013.01)

(58) Field of Classification Search
CPC ............. H01L 51/5265; H01L 51/5271; H01L 51/5225; H01L 51/5203; H01L 51/5218; H01L 51/56
See application file for complete search history.

(56) References Cited

U.S. PATENT DOCUMENTS 5,834,893 A * 11/1998 Bulovic ................. B82Y 10/00
                                                                        313/506
6,833,667 B2 * 12/2004 Hamano ............ H01L 51/5275
                                                                        313/113
(Continued)

FOREIGN PATENT DOCUMENTS

CN    102646769 A    8/2012
CN    103413896 A    11/2013
(Continued)

OTHER PUBLICATIONS

First Chinese Office Action dated Jul. 27, 2016, Appln. No. 201510104568.2.
(Continued)

*Primary Examiner* — William Coleman
(74) *Attorney, Agent, or Firm* — Ladas & Parry LLP

(57) ABSTRACT

Disclosed are a light-emitting member and a method for preparing the same as well as a display device. The light-emitting member includes a first electrode layer, a second electrode layer having a polarity opposite to that of the first electrode layer, a light-emitting layer and an isolation layer, the light-emitting layer is located on the first electrode layer, the second electrode layer is located on a side of the light-emitting layer, and the isolation layer is located on a
(Continued)

side of the first electrode layer to isolate the first electrode layer from the second electrode layer.

20 Claims, 4 Drawing Sheets

(56) References Cited

U.S. PATENT DOCUMENTS

| | | | |
|---|---|---|---|
| 7,138,764 B2* | 11/2006 | Koyama | H01L 33/385 |
| | | | 313/113 |
| 7,531,957 B2* | 5/2009 | Sakamoto | H01L 51/5237 |
| | | | 313/498 |
| 2003/0094897 A1 | 5/2003 | Koyama et al. | |
| 2008/0157105 A1 | 7/2008 | Fong et al. | |
| 2015/0001491 A1 | 1/2015 | Kaneko et al. | |

FOREIGN PATENT DOCUMENTS

| | | |
|---|---|---|
| CN | 104157768 A | 11/2014 |
| CN | 104253237 A | 12/2014 |
| CN | 104810482 A | 7/2015 |
| JP | 2014-197525 A | 10/2014 |

OTHER PUBLICATIONS

International Search Report and Written Opinion both dated Nov. 6, 2015; PCT/CN2015/089425.

* cited by examiner

LIGHT-EMITTING MEMBER AND METHOD FOR PREPARING THE SAME AS WELL AS DISPLAY DEVICE

TECHNICAL FIELD

Embodiments of the present invention relate to a light-emitting member and a method for preparing the same as well as a display device.

BACKGROUND ART

With the rapid development of display technology, an increasing number of light-emitting members are being used in display devices. OLED (Organic Light-Emitting Diode) is a light-emitting member frequently used in a display device. Display devices based on OLED light-emitting members have received a great deal of popularity owing to their advantages such as lightness, low consumption, wide viewing angle, rapid response and the like.

In a display panel of a display device, OLED has a multi-layered structure, the layers of which may be an anode layer, a light-emitting layer, and a cathode layer in a bottom-up order (i.e., away from the substrate). In addition, in order to optimize the light-emitting performance, some additional layers may be further provided between the anode layer and the light-emitting layer and between the cathode layer and the light-emitting layer. Generally, an isolation layer can be further provided on a side of the above various layers for isolating anode layers of adjacent OLEDs.

SUMMARY OF THE INVENTION

Embodiments of the present invention provide a light-emitting member, comprising a first electrode layer, a second electrode layer having a polarity opposite to that of the first electrode layer, a light-emitting layer, and an isolation layer, wherein the light-emitting layer is located on the first electrode layer, the second electrode layer is located on a side of the light-emitting layer, and the isolation layer is located on a side of the first electrode layer to isolate the first electrode layer from the second electrode layer.

Optionally, a cross-sectional shape of the light-emitting layer is a trapezoidal body, and a surface, adjacent to the first electrode layer, of the light-emitting layer is a smaller bottom surface of the trapezoidal body.

Optionally, the adjacent side surfaces of the second electrode layer and the light-emitting layer have the same inclination angle.

Optionally, a material of the second electrode layer comprises a reflective material.

Optionally, a lower edge of the light-emitting layer adjacent to a side surface of the second electrode layer is in contact with the edge of a top surface of the isolation layer.

Optionally, the first electrode layer is an anode layer and the second electrode layer is a cathode layer.

Optionally, a hole transport layer is provided between the first electrode layer and the light-emitting layer.

Optionally, a hole injection layer provided between the first electrode layer and the light-emitting layer.

Optionally, an electron transport layer is provided between the second electrode layer and the light-emitting layer.

Optionally, a hole blocking layer is provided between the second electrode layer and the light-emitting layer.

Optionally, an electron blocking layer is provided between the first electrode layer and the light-emitting layer.

Optionally, an electron injection layer is disposed between the second electrode layer and the light-emitting layer.

Optionally, the material of the first electrode layer comprises a reflective material.

Embodiments of the present invention further provide a display device, comprising the light-emitting member as set forth above.

Embodiments of the present invention further provide a method for preparing a light-emitting member, wherein the light-emitting member comprises a first electrode layer, a second electrode layer having a polarity opposite to that of the first electrode layer, a light-emitting layer, and an isolation layer, the method comprising: forming the first electrode layer on a substrate; forming the isolation layer on a side of the first electrode layer on the substrate; forming the second electrode layer on the isolation layer, the second electrode layer being isolated from the first electrode layer by the isolation layer; and forming the light-emitting layer on a side of the second electrode layer and on the first electrode layer.

Optionally, in the method, the first electrode layer is an anode layer and the second electrode layer is a cathode layer.

For example, the method further comprises: forming a hole injection layer on the first electrode layer and forming a hole transport layer on the hole injection layer, after forming the first electrode layer on the substrate.

For example, the method further comprises: forming an electron transport layer on a side of the second electrode layer and forming a hole blocking layer on a side of the electron transport layer away from the second electrode layer, after forming the second electrode layer on the isolation layer.

For example, in the method, the light-emitting layer is formed on a side of the hole blocking layer away from the electron transport layer and on the hole transport layer.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

During study, inventors of the present invention at least found out the following technical problems: during operation of an existing OLED, light-emitting layers will emit light in various directions. The light emitted upward can be emitted only after passing through the cathode layer and the various layers between the cathode layer and the light-emitting layer; and the light emitted downward can be emitted only after passing through the various layers between the anode layer and the light-emitting layer to be reflected by the anode layer and then passing through all the layers other than the anode layer. It can be seen that the light emitted upward and downward can be emitted only after going through many times of refraction, whereas each refraction during propagation of light is accompanied by energy loss. Therefore, the above structure will significantly reduces the luminous efficiency.

Embodiment 1

Figure 1:
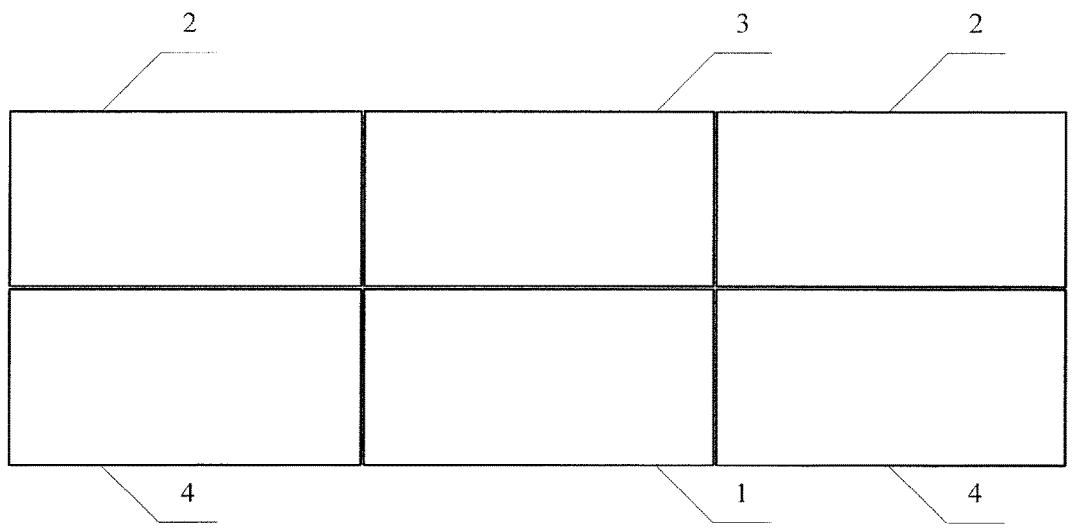
FIG. 1 is a schematic structural view of a light-emitting member according to an embodiment of the present invention.

Embodiments of the present invention provide a light-emitting member, as shown in FIG. 1, comprising a first electrode layer 1, a second electrode layer 2 having a polarity opposite to that of the first electrode layer 1, a light-emitting layer 3 and an isolation layer 4.

The light-emitting layer 3 is located on the first electrode layer 1, the second electrode layer 2 is located on a side of the light-emitting layer 3, and the isolation layer 4 is located on a side of the first electrode layer 1 to isolate the first electrode layer 1 from the second electrode layer 2.

In the embodiments of the present invention, the light-emitting member comprises a first electrode layer 1, a second electrode layer 2 having a polarity opposite to that of the first electrode layer 1, a light-emitting layer 3 and an isolation layer 4. The light-emitting layer 3 is located on the first electrode layer 1, the second electrode layer 2 is located on the side of the light-emitting layer 3, and the isolation layer 4 is located on the side of the first electrode layer 1 to isolate the first electrode layer 1 from the second electrode layer 2. As such, the light emitted upward and downward by the light-emitting layer 3 does not need to be refracted through the second electrode layer 2 upon emission from the light-emitting member, which reduces the number of times of light refraction, thereby improving the luminous efficiency of the light-emitting member.

Embodiment 2

Embodiments of the present invention provide a light-emitting member, as shown in FIG. 1, comprising a first electrode layer 1, a second electrode layer 2 having a polarity opposite to that of the first electrode layer 1, a light-emitting layer 3 and an isolation layer 4. The light-emitting layer 3 is located on the first electrode layer 1, the second electrode layer 2 is located on the side of the light-emitting layer 3, and the isolation layer 4 is located on the side of the first electrode layer 1 to isolate the first electrode layer 1 from the second electrode layer 2.

The light-emitting member can be an OLED display panel or any OLED unit in the OLED display panel. If the first electrode layer 1 is an anode layer, then the second electrode layer 2 can be a cathode layer; if the first electrode layer 1 is a cathode layer, then the second electrode layer 2 can be an anode layer.

Figure 2A:
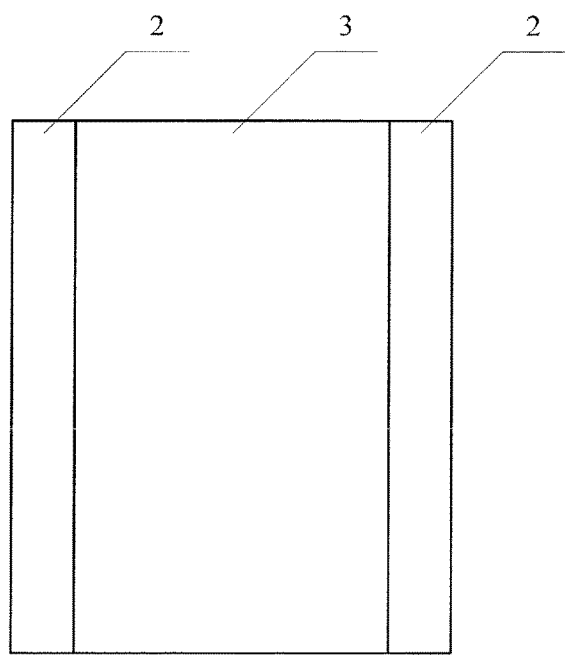
FIG. 2*a* and FIG. 2*b* are schematic structural views of a light-emitting member according to an embodiment of the present invention.
Figure 2B:
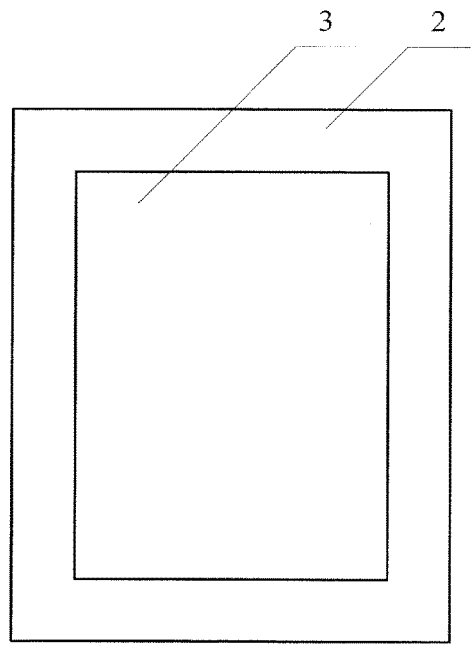

In this embodiment, the first electrode layer 1 and the isolation layer 4 can be disposed on the substrate. The isolation layer 4 can be disposed on the side of the first electrode layer 1. If the first electrode layer 1 is an anode layer, then the isolation layer 4 may surround the first electrode layer 1 on all the sides thereof so that the anode layers of all OLED units in the display panel are isolated from each other. The second electrode layer 2 may be disposed on the isolation layer 4. The isolation layer 4 isolates the first electrode layer 1 from the second electrode layer 2 to prevent the first electrode layer 1 and the second electrode layer 2 from forming a direct current there between. The light-emitting layer 3 may be disposed on the first electrode layer 1. The second electrode layer 2 can be disposed on the isolation layer 4, and is located on the side of the light-emitting layer 3. The second electrode layer 2 can be disposed either on a side or both sides of the light light-emitting layer 3 (the corresponding top view is as shown in FIG. 2a); alternatively, the second electrode layer 2 can be disposed on all sides (generally four sides) of the light-emitting layer 3 (the corresponding top view is as shown in FIG. 2b). The thickness of the second electrode layer 2 can be appropriately set depending on the requirement such as power consumption and can be the same as that of the light-emitting layer 3. A protective layer can be further provided on the uppermost layer for preventing the entire light-emitting member from being eroded. Some special functional layers, e.g., hole transport layers, can be further provided between the light-emitting layer 3 and the first electrode layer 1 and between the light-emitting layer 3 and the second electrode layer 2, which will be described below in detail.

The isolation layer 4 can be formed of an insulating material. The material of the light-emitting layer 3 can be a light-emitting material of any primary color (such as red, green and blue), which can be a fluorescent material or a phosphorescent material. The phosphorescence of the red light-emitting layer can be a DCJTB ((1,1,7,7-tetramethyl julolidyl-9-enyl)-4H-pyran) derivative, a stellate DCM (4-(dicyanomethylene)-2-methyl-6-(4-dimethylaminostyryl)-4H-pyran) derivative, a polycyclic aromatic hydrocarbon, or the like. The green fluorescent material may a quinacridone derivative, a coumarin derivative, a polycyclic aromatic hydrocarbon or the like. The blue fluorescent material may be a diaryl anthracene derivative, an aromatic stilbene derivative, a pyrene derivative, a spirobifluorenyl derivative or the like. The host material of the phosphorescent material may be a primary light-emitting material containing carbazolyl groups, a primary light-emitting material having electron transport properties or the like, while the red phosphorescent dopant material may be an Ir (iridium) complex or the like, the green phosphorescent dopant material may be a Pt (platinum) complex or the like, and the blue phosphorescent dopant material may an FIrpic (bis(4,6-difluorophenylpyridinato-N,C2)picolinatoiridium) or the like.

Optionally, the first electrode layer 1 is an anode layer and the second electrode layer 2 is a cathode layer.

In this embodiment, the isolation layer 4 may surround the anode layer on all sides thereof, which may isolate the anode layers in all OLEDs from each other. For example, the cathode layer of any OLED unit and the cathode layer of the adjacent OLED unit may be integral by a coating process. Alternatively, the cathode layers of all OLEDs in the display panel may be integral by a coating process. This simplifies the production process of OLED.

Optionally, the material of the first electrode layer 1 comprises a reflective material.

In this embodiment, if the first electrode layer 1 is an anode layer, then the anode layer can employ, for example, a three-layered structure of ITO (indium tin oxide)-Ag-ITO, wherein ITO is a transparent material, which may be replaced by IZO (indium zinc oxide), GITO (gallium indium tin oxide), GIZO (indium gallium zinc oxide) and other substances, where Ag (silver) may serve the function of reflection.

Figure 3:
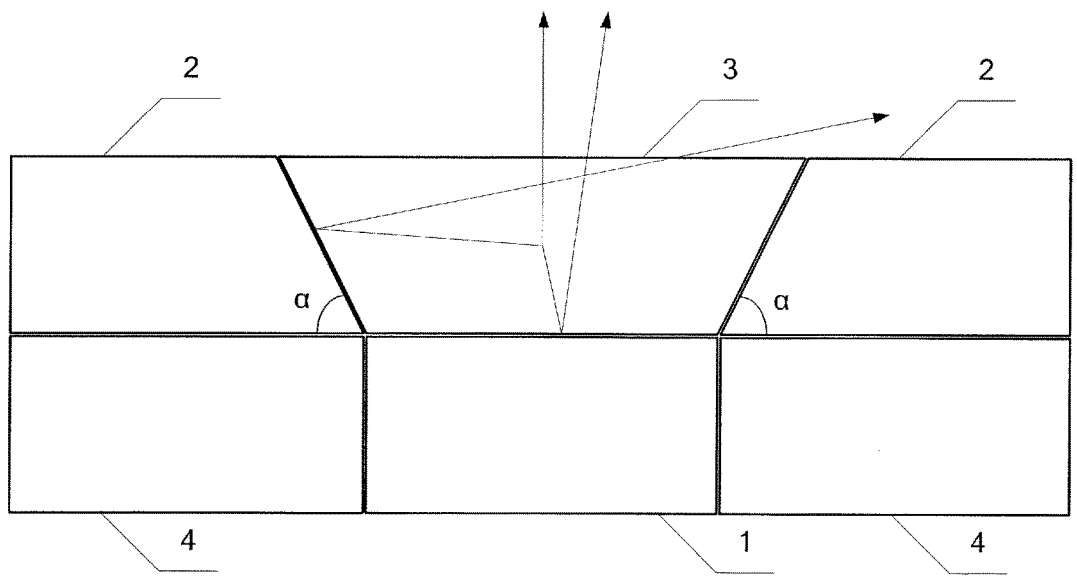
FIG. 3 is a schematic structural view of a light-emitting member according to an embodiment of the present invention.

Optionally, on the basis of the above structure, in order to improve the aperture ratio of the display panel, the shape of the light-emitting layer 3 may be specifically designed. As shown in FIG. 3, the corresponding structure may be as follows: the shape of the light-emitting layer 3 is an inverted trapezoidal body, and the surface of the light-emitting layer 3 adjacent to the first electrode layer 1 is a smaller bottom surface of the trapezoidal body.

For example, the smaller bottom surface of the inverted trapezoidal body together with the upper surface of the first electrode layer 1 may be a congruent rectangle; alternatively, the graph of the smaller bottom surface of the trapezoidal body may comprise the graph of the upper surface of the first electrode layer 1, i.e., the projection of the first electrode layer 1 perpendicular to the smaller bottom surface of the trapezoidal body may be included within the scope of the bottom surface. In the above structure, the area of the larger bottom surface of the trapezoidal body is the actual light-emitting area of OLED so that the aperture ratio can be effectively increased with respect to the structure where the light-emitting layer 3 is a trapezoidal body.

Optionally, based on the above structure where the light-emitting layer 3 is a trapezoidal body, the shape of the second electrode layer 2 can be correspondingly set, with the corresponding structure being as follows: adjacent side surfaces of the second electrode layer 2 and the light-emitting layer 3 have the same inclination angle.

For example, referring to FIG. 3, the second electrode layer 2 may be a trapezoidal body, as a result of which, a side surface of the second electrode layer 2 and a side surface of the light-emitting layer 3 can be parallel to each other. Some other layers, such as an electron transport layer, a hole blocking layer, an electron injection layer and the like, can be further provided between the two side surfaces.

Optionally, based on the above structure where the light-emitting layer 3 and the second electrode layer 2 are trapezoidal bodies, in order to improve the luminous efficiency and the viewing angle more effectively, the following structure can be employed: the material of the second electrode layer 2 may further comprise a reflective material.

For example, if the second electrode layer 2 is a cathode layer, its material may be a mixture of Ag and Mg (magnesium). As shown in FIG. 3, the light emitted from the side of the light-emitting layer 3 to the side surface of the second electrode layer 2 is then reflected; compared with other light emitted from the light-emitting layer, the included angle between the reflected light and the display panel is closer to 0 degree, thereby effectively improving the viewing angle of the display panel. Moreover, the light emitted in side direction is mostly emitted by reflection, thereby effectively improving the luminous efficiency. With such a structure, the inclination angle α of the side surface of the second electrode layer 2 is reasonably set to avoid total reflection of the light reflected by the second electrode layer 2 in the process of refraction through various layers.

In addition, on the basis that the first electrode layer 1 and the second electrode layer 2 are designed using a reflective material, when the display panel does not emit light, the first electrode layer 1 and the second electrode layer 2 of each OLED on the display panel can reflect light. The display panel acts as a very good mirror.

Optionally, in order to ensure that the carriers (electrons and holes) of the OLED during operation can be fully injected into the light-emitting layer 3, the structure of the light-emitting member may be set as follows: the lower edge of the light-emitting layer 3 adjacent to the side surface of the second electrode layer 2 is in contact with the edge of the top surface of the isolation layer 4.

For example, as shown in FIG. 3, the bottom surface of the light-emitting layer 3 and the top surface of the isolation layer 4 can be in the same plane, and their adjacent sides can be fitted. As such, electrons will not directly flow to the anode layer bypassing the light-emitting layer 3 and holes will not directly flow to the cathode layer bypassing the light-emitting layer 3, which ensures full combination of electrons and holes in the light-emitting layer 3, thereby effectively improving the work efficiency of OLED.

Figure 4:
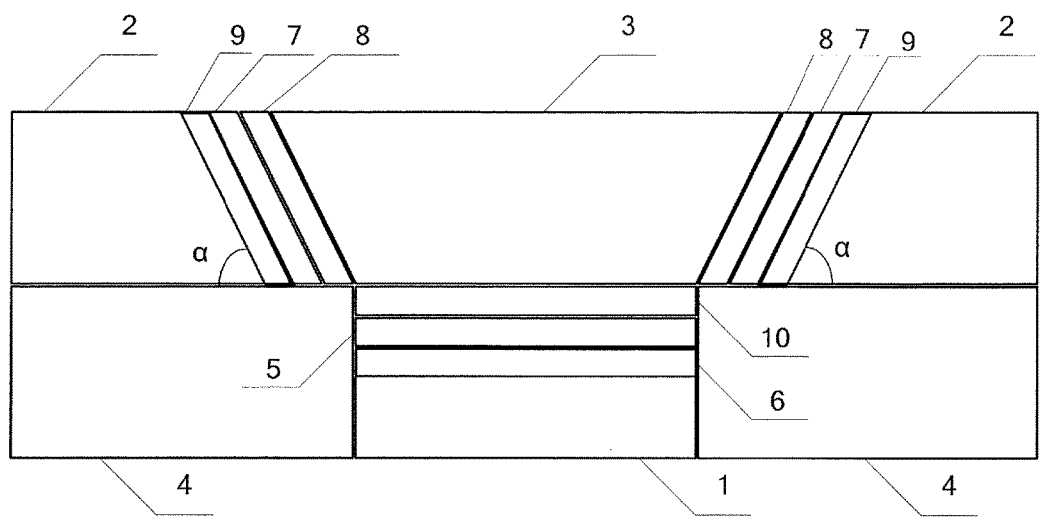
FIG. 4 is schematic structural view of a light-emitting member according to an embodiment of the present invention.

Optionally, as shown in FIG. 4, different functional layers can be set on the above structure to improve the performance of OLED. In the case of the first electrode layer 1 is an anode layer and the second electrode layer 2 is a cathode layer, the following specific exemplary modes are given:

Mode 1: a hole transport layer 5 is provided between the first electrode layer 1 and the light-emitting layer 3.

Mode 2: a hole injection layer 6 provided between the first electrode layer 1 and the light-emitting layer 3.

Mode 3: an electron transport layer 7 is provided between the second electrode layer 2 and the light-emitting layer 3.

Mode 4: a hole blocking layer 8 is provided between the second electrode layer 2 and the light-emitting layer 3.

Mode 5: an electron injection layer 9 is provided between the first electrode layer 2 and the light-emitting layer 3.

Mode 6: an electron blocking layer 10 is provided between the first electrode layer 1 and the light-emitting layer 3.

In the embodiments of the present invention, the transmission rate of the hole can be improved via the hole transport layer 5 or the hole injection layer 6, thereby improving the luminance of OLED. The transmission rate of the electron can be improved via the electron transport layer 7 or the electron injection layer 9, thereby improving the luminance of OLED. The hole can be prevented from flowing to the cathode layer 2 from the light-emitting layer 3 via the hole blocking layer 8, thereby improving the luminance of OLED. The electron can be prevented from flowing to the anode layer 1 from the light-emitting layer 3 via the electron blocking layer 8, thereby improving the luminance of OLED.

Figure 5:
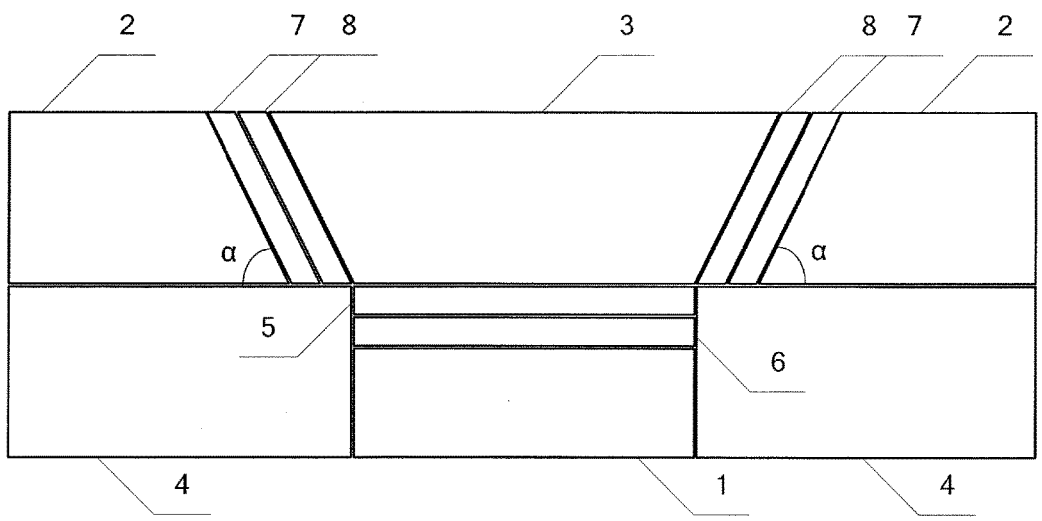
FIG. 5 is a schematic structural view of a light-emitting member according to another embodiment of the present invention.

One or more of the above six layers can be chosen to be set in the OLED depending on the actual requirements. As shown in FIG. 5, a possible structure is provided, where a hole transport layer 5 is provided between the first electrode layer 1 and the light-emitting layer 3, a hole injection layer 6 is provided between the first electrode layer 1 and the hole transport layer 5, an electron transport layer 7 is provided between the second electrode layer 2 and the light-emitting layer 3, and a hole blocking layer 8 is provided between the electron transport layer 7 and the light-emitting layer 3. In this structure, the upper surface of the hole transport layer 5 and the upper surface of the isolation layer 4 can be in the same plane. The thickness of the isolation layer 4 can be equal to the sum of the thicknesses of the first electrode layer 1, the hole injection layer 6 and the hole transport layer 5. The thickness of the light-emitting layer 3 may be equal to that of the second electrode layer 2.

The material of the hole transport layer 5 may be NPB (n-bromopropane) or a biphenyl diamine derivative; the material of the hole injection layer 6 may be copper phthalocyanine or the like; the material of the electron transport layer 7 may be a quinoline derivative, a dinitrogen anthracene derivative, a silicon-containing heterocyclic compound, a quinoxaline derivative, a phenanthroline derivative, a perfluorinated oligomer, or the like; the material of the electron injection layer 9 may be an alkali metal oxide $Li_2O$ (lithium oxide), $LiBO_2$ (lithium metaborate), $K_2SiO_3$ (potassium silicate), $Cs_2CO_3$ (cesium carbonate) or the like, or alkali metal acetate, alkali metal fluoride or the like.

In this embodiment, the light-emitting member comprises a first electrode layer 1, a second electrode layer 2 having a polarity opposite to that of the first electrode layer 1, a light-emitting layer 3 and an isolation layer 4, wherein the light-emitting layer 3 is located on the first electrode layer 1, the second electrode layer 2 is located on the side of the light-emitting layer 3, and the isolation layer 4 is located on the side of the first electrode layer 1 to isolate the first electrode layer 1 from the second electrode layer 2. In this case, the light emitted by the light-emitting layer 3 upward and downward does not need to be refracted through the second electrode layer 2 during emission from the light-emitting member, which reduces the number of times of light refraction, thereby improving the luminous efficiency of the light emitting member.

Embodiment 3

Embodiments of the present invention further provide a display panel, comprising the light-emitting member set forth in the above embodiments. The display panel may be a display panel, a display, a TV set, a mobile phone, a tablet computer or the like.

In the present embodiment, the light-emitting member comprises a first electrode layer 1, a second electrode layer 2 having a polarity opposite to that of the first electrode layer 1, a light-emitting layer 3 and an isolation layer 4, wherein the light-emitting layer 3 is located on the first electrode layer 1, the second electrode layer 2 is located on the side of the light-emitting layer 3, and the isolation layer 4 is located on the side of the first electrode layer 1 to isolate the first electrode layer 1 from the second electrode layer 2. In this case, the light emitted by the light-emitting layer 3 upward and downward does not needs to be refracted through the second electrode layer 2 during emission from the light-emitting member, which reduces the number of times of light refraction, thereby improving the luminous efficiency of the light emitting member.

Embodiment 4

Figure 6:
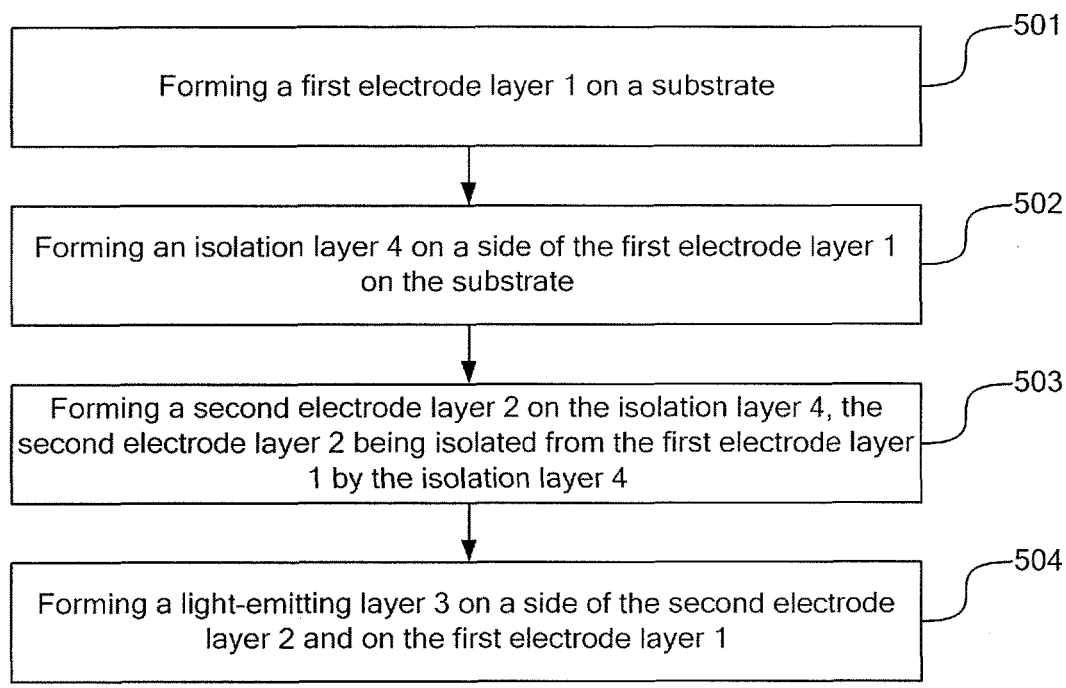
FIG. 6 is a flow chart of a method for preparing a light-emitting member according to an embodiment of the present invention.

Embodiments of the present invention further provide a method for preparing a light-emitting member, i.e., for preparing the light-emitting member in the above embodiment. The light-emitting member comprises a first electrode layer 1, a second electrode 2 having a polarity opposite to that of the first electrode layer 1, a light-emitting layer 3 and an isolation layer 4. As shown in FIG. 6, the processing scheme of the method may comprise the following steps:

Step 501: forming a first electrode layer 1 on a substrate.

For example, a pixel circuit may be first formed on the substrate, which may include low-temperature polysilicon, microcrystalline silicon or OTFT (Organic Thin Film Transistor). Moreover, a first electrode layer 1 can be formed in the circuit, and a coating process such as evaporation, sputtering and the like can be employed in the production process.

Optionally, as to the condition in which the first electrode layer 1 is an anode layer and the second electrode layer 2 is a cathode layer, after forming the first electrode layer 1, the following process may be further carried out: forming a hole injection layer 6 on the first electrode layer 1 and forming a hole transport layer 5 on the hole injection layer 6.

For example, a coating process can be employed to form a hole injection layer 6 on the first electrode layer 1 and to form a hole transport layer 5 on the hole injection layer 6. Besides, an electron blocking layer 10 can be formed on the hole transport layer 5 for preventing the electron from flowing to the hole transport layer 5 from the light-emitting layer 3. In addition, either the hole transport layer 5 or the hole injection layer 6 may be chosen to be disposed on the first electrode layer 1. Regarding the materials employed for the above various layers, please refer to Embodiment 2.

Step 502: forming an isolation layer 4 on the side of the first electrode layer 1 on the substrate.

For example, a coating process may be employed to form an isolation layer 4 of an insulating substance on the side of the first electrode layer 1. The isolation layers 4 of all OLED units in the display panel may be an integral by a coating process. As to the above condition in which a hole transport layer 5 and a hole injection layer 6 are provided, the isolation layer 4 may be formed on the sides of the first electrode layer 1, the hole transport layer 5 and the hole injection layer 6.

Step 503: forming a second electrode layer 2 on the isolation layer 4, the second electrode layer 2 being isolated from the first electrode layer 1 by the isolation layer 4.

For example, a coating process may be employed to form a second electrode layer 2 of the trapezoidal body on the isolation layer 4. For example, by means of sputtering, a second electrode layer 2 is formed on the isolation layer 4 by a mixture of Ag and Mg. As to the condition in which the second electrode layer 2 is a cathode layer, the second electrode layers 2 of all OLED units in the display panel may be an integral by a coating process.

Optionally, as to the condition in which the first electrode layer 1 is an anode layer and the second electrode layer 2 is a cathode layer, after forming a second electrode layer 2 on the isolation layer 4, the following treatment may be further carried out: forming an electron transport layer 7 on the side of the second electron layer 2 and forming a hole blocking layer 8 on the side of the electron transport layer 7 that faces away from the second electrode layer 2.

For example, a coating process may be employed to form an electron transport layer 7 and a hole blocking layer 8 on the sidewall of the second electrode layer 2, the electron transport layer 7 and the hole blocking layer 8 being parallel to the sidewall of the second electrode layer 2. Further, prior to forming the electron transport layer 7, an electron injection layer 9 is formed on the sidewall of the second electron layer 2. In addition, either the electron transport layer 7 or the hole blocking layer 8 is chosen to be disposed on the side of the second electrode layer 2. The materials employed for the above various layers may be chosen according to the above embodiments.

Step 504: forming a light-emitting layer 3 on the side of the second electrode layer 2 and on the first electrode layer 1.

For example, a coating process may be employed to form a light-emitting layer 3 of an inverted trapezoidal body. For example, a light-emitting layer 3 is formed by a coating process. After forming a light-emitting layer 3, a coating process may be further employed to form a protective layer on the light-emitting layer 3 and the second electrode layer 2.

As to the above condition in which a hole transport layer 5, a hole injection layer 6, an electron transport layer 7 and a hole blocking layer 8 are formed, the processing of Step 504 may be as follows: forming a light-emitting layer 3 on the side of the hole blocking layer 8 that faces away from the electron transport layer 7 and on the hole transport layer 5.

In this embodiment, the light-emitting member comprises a first electrode layer 1, a second electrode layer 2 having a polarity opposite to that of the first electrode layer 1, a light-emitting layer 3 and an isolation layer 4, wherein the light-emitting layer 3 is located on the first electrode layer 1, the second electrode layer 2 is located on the side of the light-emitting layer 3, and the isolation layer 4 is located on the side of the first electrode layer 1 to isolate the first electrode layer 1 from the second electrode layer 2. As such, the light emitted upward and downward by the light-emitting layer 3 does not need to be refracted through the second electrode layer 2, which reduces the number of times of light refraction, thereby improving the luminous efficiency of the light-emitting member.

The above are merely exemplary embodiments of the present invention, and are not intended to limit the scope of protection of the present invention, which is yet determined by the appended claims.

The present application claims the priority of the Chinese patent application No. 201510104568.2 on Mar. 10, 2015, the entirety of which is incorporated herein by reference as a part of the present application.

The invention claimed is:

1. A light-emitting member, comprising a substrate, a first electrode layer, a second electrode layer having a polarity opposite to that of the first electrode layer, a light-emitting layer, and an isolation layer, wherein:
the light-emitting layer is located on the first electrode layer, the second electrode layer is located on a side of the light-emitting layer, and the isolation layer is located on a side of the first electrode layer to isolate the first electrode layer from the second electrode layer;
a projection of the second electrode layer on the substrate is not overlapped with a projection of the first electrode layer on the substrate, and a projection of the second electrode layer on the substrate is not overlapped with a projection of the light-emitting layer on the substrate.

2. The light-emitting member according to claim 1, wherein a cross-sectional shape of the light-emitting layer is a trapezoidal body, and a surface, adjacent to the first electrode layer, of the light-emitting layer is a smaller bottom surface of the trapezoidal body.

3. The light-emitting member according to claim 1, wherein adjacent side surfaces of the second electrode layer and the light-emitting layer have a same inclination angle.

4. The light-emitting member according to claim 1, wherein a material of the second electrode layer comprises a reflective material.

5. The light-emitting member according to claim 1, wherein a lower edge, adjacent to a side surface of the second electrode layer, of the light-emitting layer is in contact with an edge of a top surface of the isolation layer.

6. The light-emitting member according to claim 1, wherein the first electrode layer is an anode layer and the second electrode layer is a cathode layer.

7. The light-emitting member according to claim 1, wherein a hole transport layer is provided between the first electrode layer and the light-emitting layer.

8. The light-emitting member according to claim 1, wherein a hole injection layer is provided between the first electrode layer and the light-emitting layer.

9. The light-emitting member according to claim 1, wherein an electron transport layer is provided between the second electrode layer and the light-emitting layer.

10. The light-emitting member according to claim 1, wherein a hole blocking layer is provided between the second electrode layer and the light-emitting layer.

11. The light-emitting member according to claim 1, wherein an electron blocking layer is provided between the first electrode layer and the light-emitting layer.

12. The light-emitting member according to claim 1, wherein an electron injection layer is provided between the second electrode layer and the light-emitting layer.

13. The light-emitting member according to claim 1, wherein a material of the first electrode layer comprises a reflective material.

14. A display device, comprising the light-emitting member according to claim 1.

15. A method for preparing a light-emitting member, wherein the light-emitting member comprises a first electrode layer, a second electrode layer having a polarity opposite to that of the first electrode layer, a light-emitting layer, and an isolation layer, the method comprising:
forming the first electrode layer on a substrate;
forming the isolation layer on a side of the first electrode layer on the substrate;
forming the second electrode layer on the isolation layer, the second electrode layer being isolated from the first electrode layer by the isolation layer; and
forming the light-emitting layer on a side of the second electrode layer and on the first electrode layer;
a projection of the second electrode layer on the substrate is not overlapped with a projection of the first electrode layer on the substrate, and a projection of the second electrode layer on the substrate is not overlapped with a projection of the light-emitting layer on the substrate.

16. The method according to claim 15, wherein the first electrode layer is an anode layer and the second electrode layer is a cathode layer.

17. The method according to claim 16, after forming the first electrode layer on the substrate, further comprising: forming a hole injection layer on the first electrode layer and forming a hole transport layer on the hole injection layer.

18. The method according to claim 16, after forming the second electrode layer on the isolation layer, further comprising: forming an electron transport layer on a side of the second electrode layer and forming a hole blocking layer on a side of the electron transport layer away from the second electrode layer.

19. The method according to claim 17, after forming the second electrode layer on the isolation layer, further comprising: forming an electron transport layer on a side of the second electrode layer and forming a hole blocking layer on a side of the electron transport layer away from the second electrode layer.

20. The method according to claim 19, wherein the light-emitting layer is formed on a side of the hole blocking layer away from the electron transport layer and on the hole transport layer.

* * * * *